(12) United States Patent
Fedorikhin

(10) Patent No.: US 12,352,203 B2
(45) Date of Patent: Jul. 8, 2025

(54) TURBOMACHINE WITH E-MACHINE CONTROLLER HAVING COOLED BUS BAR MEMBER

(71) Applicant: Garrett Transportation I Inc, Torrance, CA (US)

(72) Inventor: Valeriy Fedorikhin, Redondo Beach, CA (US)

(73) Assignee: GARRETT TRANSPORTATION I INC., Torrance, CA (US)

( * ) Notice: Subject to any disclaimer, the term of this patent is extended or adjusted under 35 U.S.C. 154(b) by 208 days.

(21) Appl. No.: 18/145,052

(22) Filed: Dec. 22, 2022

(65) Prior Publication Data

US 2024/0209773 A1 Jun. 27, 2024

(51) Int. Cl.
*F02B 39/10* (2006.01)
*F02B 37/10* (2006.01)
*H05K 7/20* (2006.01)

(52) U.S. Cl.
CPC .............. *F02B 39/10* (2013.01); *F02B 37/10* (2013.01); *H05K 7/20254* (2013.01); *H05K 7/20927* (2013.01)

(58) Field of Classification Search
CPC ............ H05K 7/20254; H05K 7/20927; F01D 15/10; H02K 7/1823; H02K 9/227
See application file for complete search history.

(56) References Cited

U.S. PATENT DOCUMENTS

| | | | |
|---|---|---|---|
| 8,007,255 B2 * | 8/2011 | Hattori | H02K 11/33 310/55 |
| 8,018,719 B2 * | 9/2011 | Busch | F28D 15/0233 361/679.52 |
| 10,700,043 B1 * | 6/2020 | Sullivan | H01L 23/36 |
| 11,146,144 B2 | 10/2021 | Eason et al. | |
| 11,901,836 B2 * | 2/2024 | Kudo | H02G 5/02 |

(Continued)

FOREIGN PATENT DOCUMENTS

| | | |
|---|---|---|
| DE | 102020111685 A1 * | 11/2021 |
| JP | 2015115966 A | 6/2015 |

(Continued)

OTHER PUBLICATIONS

Translation of DE-102020111685-A1 (Year: 2021).*

*Primary Examiner* — Jayprakash N Gandhi
*Assistant Examiner* — Matthew Sinclair Muir
(74) *Attorney, Agent, or Firm* — LORENZ & KOPF, LLP

(57) ABSTRACT

A turbomachine includes a rotating group with a wheel supported on a shaft. The turbomachine includes a housing that houses the wheel for rotation therein about an axis of rotation. The turbomachine includes an e-machine section with an e-machine operatively connected to the shaft and configured to convert energy between the e-machine and the shaft as the shaft rotates. Furthermore, the turbomachine includes a controller configured for control of the e-machine. The controller has a bus bar member that includes a bus bar that is partly covered over by an electrically-insulative covering member. The bus bar includes a thermal terminal surface that is exposed from the covering member. The controller includes a heat sink member, wherein the thermal terminal surface is thermally connected to the heat sink member with the heat sink member configured to receive heat from the bus bar member.

20 Claims, 7 Drawing Sheets

(56) References Cited

U.S. PATENT DOCUMENTS

| | | | |
|---|---|---|---|
| 2022/0037954 A1* | 2/2022 | Downs | H02K 1/20 |
| 2022/0368090 A1* | 11/2022 | Durse | H01R 13/502 |
| 2022/0393615 A1* | 12/2022 | Wang | H02K 11/33 |
| 2023/0118102 A1* | 4/2023 | Wallington | H02K 9/19 |
| | | | 290/52 |
| 2023/0389241 A1* | 11/2023 | Vijayaraghavan | |
| | | | H05K 7/20927 |

FOREIGN PATENT DOCUMENTS

| | | | |
|---|---|---|---|
| WO | 2021165630 A1 | 8/2021 | |
| WO | 2022239484 A1 | 11/2022 | |

* cited by examiner

TURBOMACHINE WITH E-MACHINE CONTROLLER HAVING COOLED BUS BAR MEMBER

TECHNICAL FIELD

The present disclosure generally relates to a turbomachine and, more particularly, relates to a turbomachine with an e-machine controller having a cooled overmolded bus bar.

BACKGROUND

Some turbomachines include an e-machine, such as an electric motor or electric generator. The e-machine may include a controller with various electronics components for controlling operation of the e-machine.

The controller may generate heat during operation, which may negatively affect operation. The e-machine stator may also generate heat during operation. The turbomachine may also operate and thereby increase temperature near the controller.

Thus, it is desirable to provide a turbomachine with an e-machine that includes features for cooling the controller. It is also desirable to provide such cooling features in a highly compact package. Furthermore, it is desirable to provide a turbomachine with highly effective cooling features using highly efficient manufacturing methods. Other desirable features and characteristics of the present disclosure will become apparent from the subsequent detailed description and the appended claims, taken in conjunction with the accompanying drawings and this background discussion.

BRIEF SUMMARY

In one embodiment, a turbomachine is disclosed that includes a rotating group with a wheel supported on a shaft. The turbomachine includes a housing that houses the wheel for rotation therein about an axis of rotation. The turbomachine includes an e-machine section with an e-machine operatively connected to the shaft and configured to convert energy between the e-machine and the shaft as the shaft rotates. Furthermore, the turbomachine includes a controller configured for control of the e-machine. The controller has a bus bar member that includes a bus bar that is partly covered over by an electrically-insulative covering member. The bus bar includes a thermal terminal surface that is exposed from the covering member. The controller includes a heat sink member, wherein the thermal terminal surface is thermally connected to the heat sink member with the heat sink member configured to receive heat from the bus bar member.

In another embodiment, a method of manufacturing a turbomachine is disclosed. The method includes supporting a wheel of a rotating group on a shaft. The method also includes housing the wheel in a housing for rotation therein about an axis of rotation. Furthermore, the method includes providing an e-machine section with an e-machine operatively connected to the shaft and configured to convert energy between the e-machine and the shaft as the shaft rotates. Additionally, the method includes supporting a controller on the turbomachine. The controller is configured for control of the e-machine. The controller has a bus bar member that includes a bus bar that is partly covered over by an electrically-insulative covering member. The bus bar includes a thermal terminal surface that is exposed from the covering member. The controller includes a heat sink member, and the thermal terminal surface is thermally connected to the heat sink member with the heat sink member configured to receive heat from the bus bar member.

In an additional embodiment, a turbomachine is disclosed that includes a rotating group with a wheel supported on a shaft. The turbomachine includes a housing that houses the wheel for rotation therein about an axis of rotation. Furthermore, the turbomachine includes an e-machine section with an electric motor operatively connected to the shaft and configured to drive the shaft in rotation. Also, the turbomachine includes a controller configured for control of the electric motor. The controller includes a bus bar member that includes a plurality of bus bars that are partly covered over by an electrically-insulative covering member. The bus bars respectively include a thermal terminal surface that is exposed from the covering member. The controller also includes a heat sink member. The thermal terminal surface is thermally connected to the heat sink member with the heat sink member configured to receive heat from the bus bar member. The turbomachine also includes a fluid cooling system for a flow of a fluid coolant proximate the heat sink member to remove heat from the heat sink member.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely exemplary in nature and is not intended to limit the present disclosure or the application and uses of the present disclosure. Furthermore, there is no intention to be bound by any theory presented in the preceding background or the following detailed description.

Broadly, example embodiments disclosed herein include a controller for a turbomachine that includes a variety of features that remove heat (i.e., cool) the controller. For example, the controller may include a bus bar member with at least one bar that is partly covered over by an electrically-insulating covering member. The covering member may leave a predetermined part (i.e., a thermal terminal surface) exposed. The thermal terminal surface may be thermally coupled to a heat sink provided in the controller to remove heat therefrom. The controller may, in some embodiments, be provided with a fluid cooling system. The fluid cooling system may flow through the controller and past the heat sink to remove heat from the heat sink such that the bus bar temperature is maintained within a predetermined and preferable range during operations of the turbomachine.

Accordingly, the controller of the present disclosure may have a long operating life, the turbomachine may operate at high efficiency, and/or may have other advantages. The packaging of these components may be compact and light-weight. These features may be provided at relatively low cost and may provide manufacturing efficiencies as well. For example, in some embodiments, a plurality of bus bars may be held together by a single electrically-insulating covering member, which may provide benefits for shipping, handling, assembly, etc.

Figure 1:
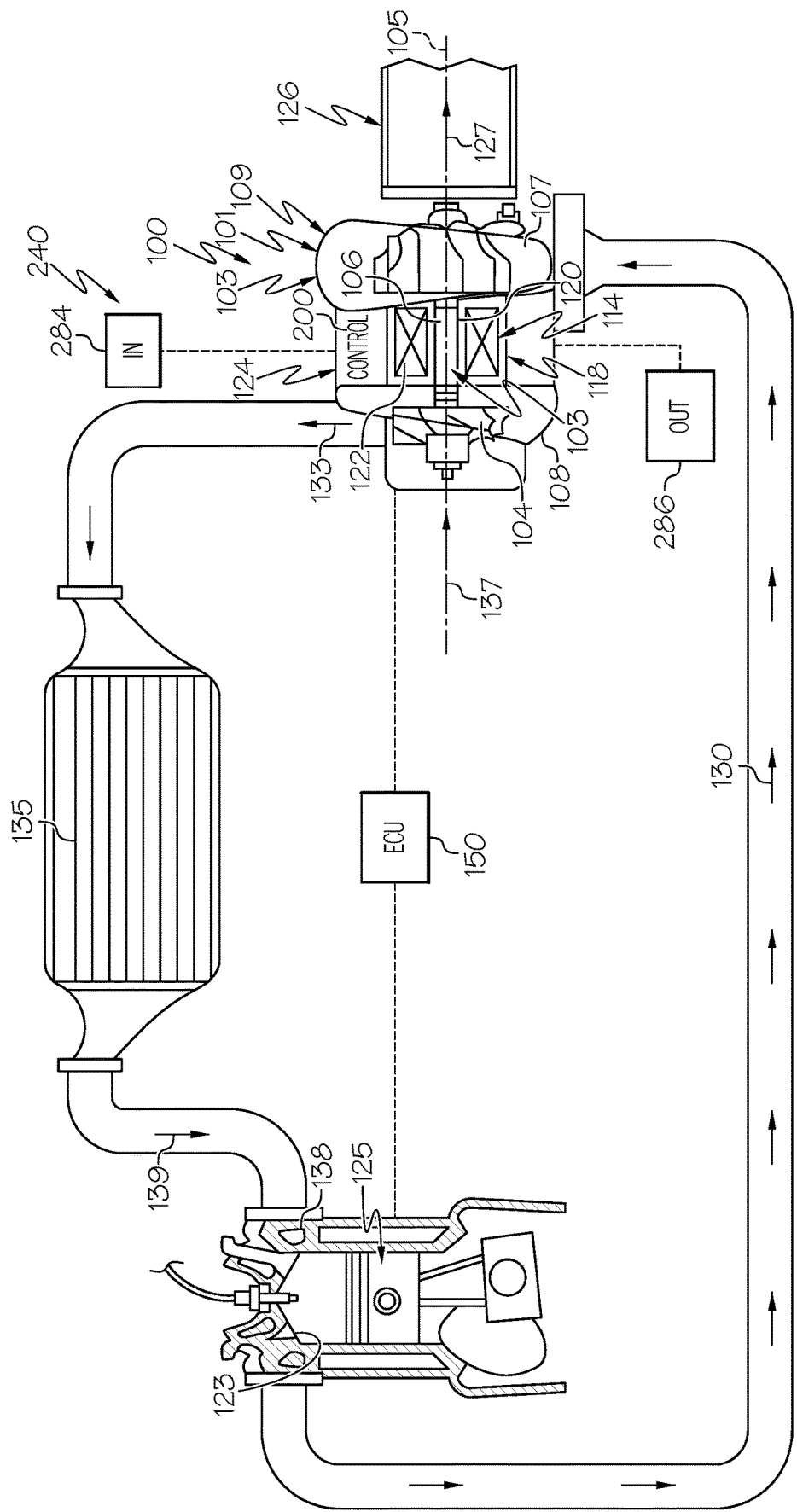
FIG. 1 is a schematic view of a system with a turbomachine configured according to example embodiments of the present disclosure.

FIG. 1 is a schematic view of an example turbomachine 100 of the present disclosure. Generally, the turbomachine 100 may include a housing 101 and a rotating group 103. The rotating group 103 is configured to rotate within the housing 101 about an axis 105 of rotation.

The rotating group 103 may include a compressor wheel 104 that is mounted on one end of a shaft 106. In some embodiments, the rotating group 103 may also include a turbine wheel 107 that is mounted on an opposite end of the shaft 106. The compressor wheel 104 may be supported within a compressor housing 108 of the housing 101 to cooperatively define a compressor section of the turbomachine 100. The turbine wheel 107 may be supported within a turbine housing 109 to cooperatively define a turbine section of the turbomachine 100.

The turbomachine 100 may also include an e-machine 114, such as an electric motor 118, that may be disposed between the compressor wheel 104 and the turbine wheel 107 along the axis 105. The electric motor 118 may be configured to drivingly rotate the shaft 106 and the other parts of the rotating group 103. In some embodiments, the e-machine 114 may be configured as an electric generator that converts rotational energy of the rotating group 103 into electric energy. In further embodiments, the e-machine 114 may have at least one motor mode in which the e-machine 114 drives the rotating group 103 in rotation, and the e-machine 114 may have at least one generator mode in which the e-machine 114 converts rotation of the rotating group 103 into electric energy.

Generally, the e-machine 114 may include a rotor member 120 that is mounted on the shaft 106, a stator member 122 that surrounds the rotor member 120, and an e-machine housing 124 that houses the stator member 122 and the rotor member 120. The e-machine housing 124 may define part of the housing 101 of the turbomachine 100 and may be connected to the compressor housing 108 on one end and the turbine housing 109 on the other.

In some embodiments, the turbomachine 100 may be provided within a vehicle with an internal combustion engine 125, and the turbomachine 100 may be operatively coupled thereto. As such, the turbine wheel 107 of the turbomachine 100 may circumferentially receive a high-pressure and high-temperature exhaust gas stream 130 from the engine 125 (e.g., from an exhaust manifold 123 of the engine 125). The turbine wheel 107 (and thus the rotating group 103) may be driven in rotation around the axis of rotor rotation 105 by the high-pressure and high-temperature exhaust gas stream 130, which becomes a lower-pressure and lower-temperature exhaust gas stream 127 that is released into a downstream exhaust pipe 126. Furthermore, the compressor wheel 104 may receive an inlet air flow 137 and output a pressurized air stream 133 to a downstream component. The pressurized air stream 133 may be characterized by an increased temperature, over that of the inlet air flow 137. Thus, the air stream 133 may be channeled through an air cooler 135 (i.e., an intercooler), such as a convectively cooled charge air cooler. The air cooler 135 may be configured to dissipate heat from the air stream 133, increasing its density. The resulting cooled and pressurized air stream 139 may be channeled into an intake manifold 138 of the internal combustion engine 125 for boosting its performance.

The operation of the system may be controlled by an ECU 150 (engine control unit) that connects and communicates with the engine 125, with the turbomachine 100, and/or other components of the system. In some embodiments, the ECU 150 may be in communication with a controller 200 of the turbomachine 100. The controller 200 may include components that are localized to the turbomachine 100, that are mounted on the housing 101, and/or that are housed within the housing 101. The controller 200 is shown schematically in FIG. 1 and is shown according to example embodiments in FIG. 2. In some embodiments, the controller 200 may be configured for controlling the speed of the rotating group 103 by controlling operations during a motor mode of the e-machine 114. The controller 200 may also be configured for controlling other operations of the e-machine 114.

As will be discussed, the controller 200 may also include components for removing heat (i.e., for cooling) the controller 200. These features can ensure that the controller 200 operates under preferred thermal conditions. As such, the controller 200 may have a long operating life, the turbomachine 100 may operate at high efficiency, and/or may have other advantages. These features may be included and the controller 200 may be compact and light-weight. These features may be provided at relatively low cost and may provide manufacturing efficiencies as well.

It will be appreciated that the turbomachine 100 may be configured differently from the embodiments represented in FIG. 1 without departing from the scope of the present disclosure. For example, in additional embodiments, the turbomachine 100 may be included in a fuel cell system and may be configured to feed compressed air to one or more fuel cells (e.g., a fuel cell system of a vehicle).

In addition, it will be appreciated that the term "turbomachine" as used herein is to be interpreted broadly, for example, to include configurations other than those represented in FIG. 1. For example, turbomachines within the scope of the present disclosure may include electrically-driven fluid-compressor devices (i.e., e-chargers, electric superchargers), hybrid turbochargers, e-boost devices, or other related machines. The turbine section of the turbomachines 100 of the present disclosure are optional and the turbomachine 100 may include a compressor section only without departing from the scope of the present disclosure.

Figure 2:
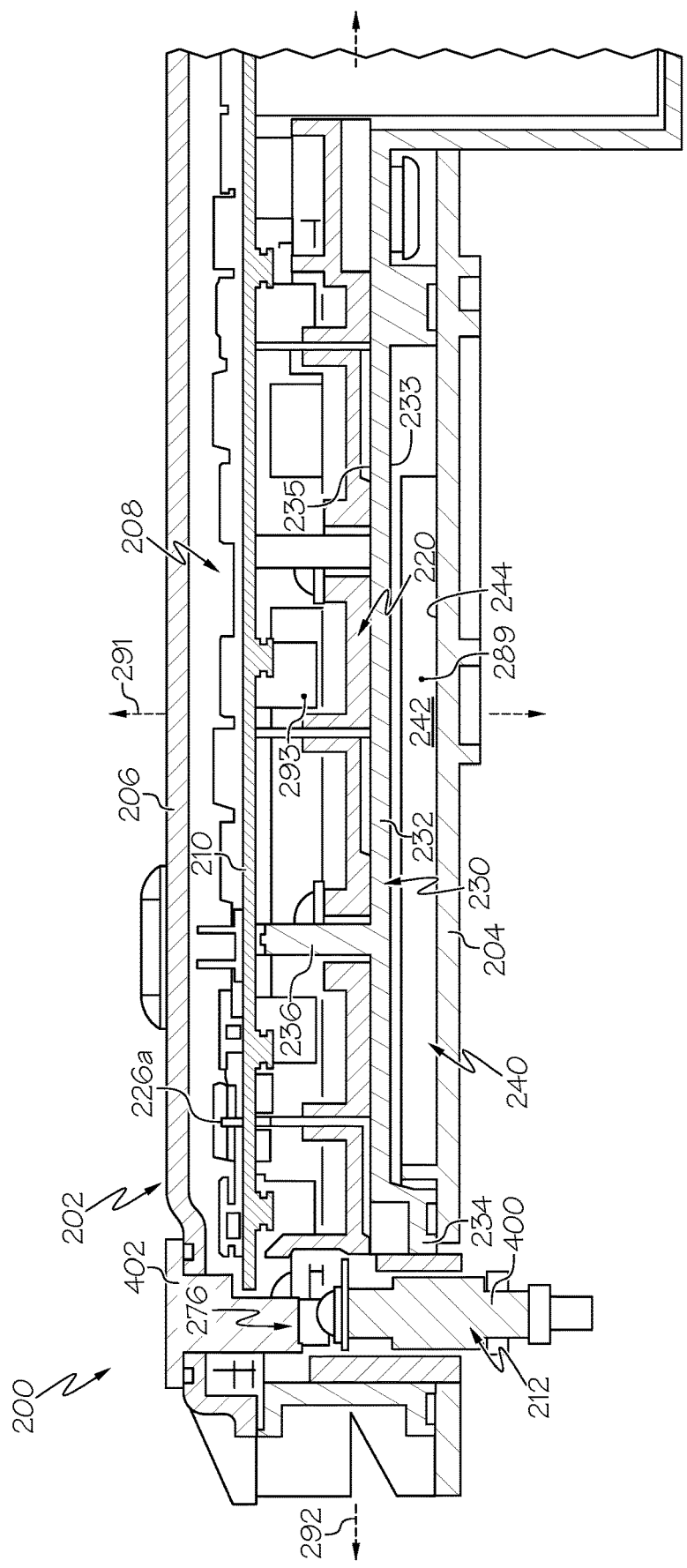
FIG. 2 is a cross sectional view of a controller of the turbomachine configured according to example embodiments of the present disclosure.

Referring now to FIG. 2, the controller 200 of the turbomachine 100 will be discussed in greater detail according to example embodiments. The controller 200 may include a controller housing 202. The controller housing 202 may be made of a rigid and strong material, such as hard polymeric material or composite. The controller housing 202 may also be made from an electrically-insulating material.

The housing 202 may have a rectangular, flat, box-like appearance that defines a Cartesian coordinate system including a first axis 291, a second axis 292, and a third axis 293. The first axis 291 may correspond to a thickness direction of the controller 200, the second axis 292 may correspond with a transverse direction that spans across the controller 200, and the third axis 293 may be normal to both of the other axes 291, 292 with the third axis 293 defining another transverse direction across the controller 200. The controller 200 may be elongated, having the largest dimension (length) measured along the second axis 292. The controller 200 may also have a flattened appearance, having the smallest dimension (thickness) measured along the first axis 291. The controller 200 may have a width dimension measured along the third axis 293 may be between the length and height dimensions of the controller 200.

In some embodiments, the controller housing 202 may include an inner housing member 204 (i.e., base, sealant plate, etc.) and an outer housing member 206 (i.e., cover, etc.) that are joined to cooperatively define a hollow interior space 208 therein. The controller housing 202 may be fixedly attached to an outer surface of the e-machine housing 124 with the inner housing member 204 overlaying (i.e., perched upon) the e-machine housing 124.

The controller 200 may also include a printed circuit board (PCB) assembly 210. The PCB assembly 210 may include a circuit board with chips (e.g., MOSFETs) mounted thereon as well as other circuit components, etc. The PCB assembly 210 may be supported within the interior space 208, proximate the outer housing member 206.

The controller 200 may further include a heat sink member 230. The heat sink member 230 may be plate-like with a central portion 232 that is substantially flat and a peripheral portion 234 that extends from the central portion 232 along the first axis 291. The peripheral portion 234 may be fixed to the inner housing member 204 such that the central portion 232 is spaced apart at a distance from the inner housing member 204. The central portion 232 may be substantially parallel to the inner housing member 204 with a first side 233 and a second side 235 that faces in the opposite direction. The heat sink member 230 may also include one or more cylindrical posts 236 that project from the second side 235 along the axis 291, away from the inner housing member 204. The posts 236 may be used to support the PCB assembly 210 with electrically insulating coupling (e.g., a gasket) therebetween. In some embodiments, the posts 236 may support other features of the controller 200 as will be discussed. The heat sink member 230 may be formed from, include, and/or constructed from a material that is highly thermally conductive, such as aluminum or other thermally conductive metal.

Figure 3:
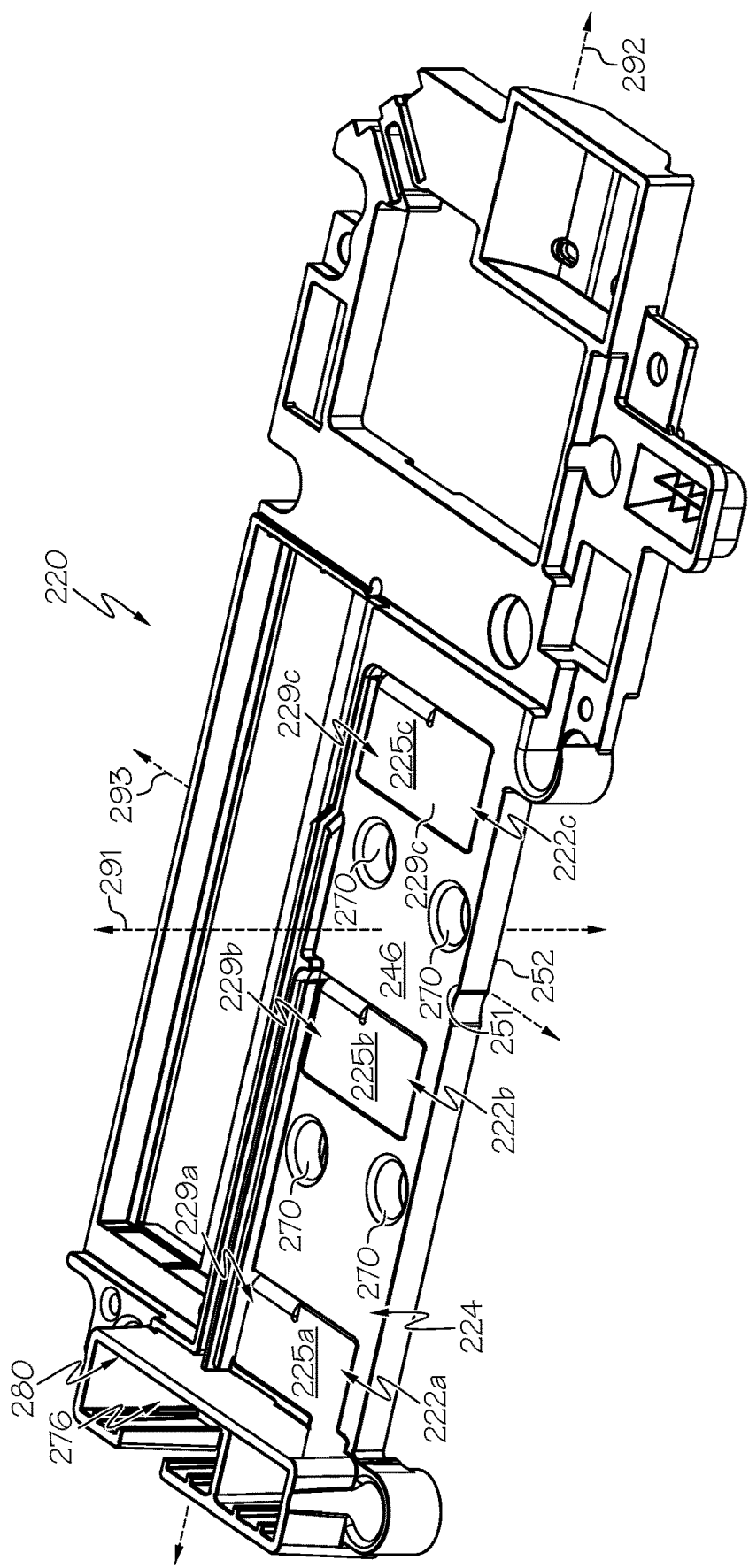
FIG. 3 is a perspective view of a bus bar member of the controller of FIG. 2.

The controller 200 may also include a bus bar member 220. The bus bar member 220 is shown in further detail in FIG. 3. It will be appreciated that the bus bar member 220 is shown in FIG. 3 inverted from the position shown in FIG. 2 (i.e., upside-down). The bus bar member 220 may be generally flat and elongated along the axis 292 with a first side 251 and a second side 252, which face in opposite directions along the axis 293.

Figure 4:
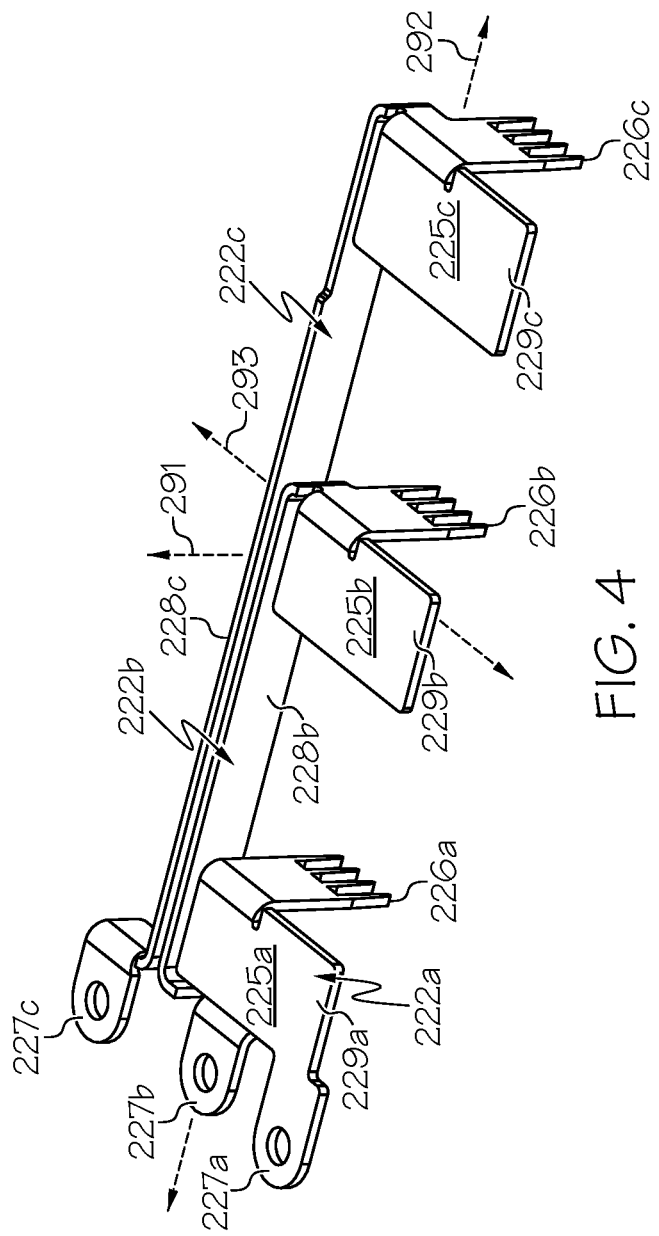
FIG. 4 is a perspective view of a plurality of bus bars of the bus bar member of FIG. 3.

The bus bar member 220 may generally include at least one bus bar 222a, 222b, 222c that is partly covered over (e.g., encased, embedded, overmolded by, and/or otherwise surrounded by) an electrically-insulating covering member 224. In some embodiments, the bus bar member 220 may include a plurality of (e.g., three) bus bars 222a, 222b, 222c, which are covered over partly by a single covering member 224. The bus bars 222a, 222b, 222c are shown in FIG. 4 with the covering member 224 hidden for clarity. As shown, the bus bars 222a, 222b, 222c may be shaped from flat sheet of conductive material, such as copper, aluminum, etc. The bus bars 222a, 222b, 222c may respectively include a forked PCB connector end 226a, 226b, 226c and a terminal end 227a, 227b, 227c. The terminal end 227a, 227b, 227c may be spaced apart from its respective PCB connector end 226a, 226b, 226c along the axis 292. At least one of the bus bars 222a, 222b, 222c may include a rail 228b, 228c that extends between the respective terminal end 227b, 227c and PCB connector end 226b, 226c. The terminal ends 227a, 227b, 227c may be disposed on one end of the controller 222, and the terminal ends 227a, 227b, 227c may be spaced apart at a distance along the third axis 293.

At least one of the bus bars 222a, 222b, 222c may include a thermal pad 229a, 229b, 229c. The thermal pad 229a, 229b, 229c may be flat and rectangular. The thermal pad 229a, 229b, 229c may be adjacent the PCB connector end 226a, 226b, 226c. In some embodiments, the thermal pad 229a, 229b, 229c may be disposed in a plane that is substantially parallel to that of the terminal end 227a, 227b, 227c. The PCB connector end 226a, 226b, 226c may be bent away from and normal to the thermal pad 229a, 229b, 229c.

As shown in FIG. 3, the thermal pad 229a, 229b, 229c may be at least partly exposed from the covering member 224. For example, in some embodiments, each of the bus bars 222a, 222b, 222c may include a thermal pad 229a, 229b, 229c with a respective thermal terminal surface 225a, 225b, 225c that is exposed from the covering member 224. The thermal terminal surfaces 225a, 225b, 225c may be exposed from the covering member 224 on the first side 251 of the bus bar member 220. Also the thermal terminal surfaces 225a, 225b, 225c may be spaced apart along the axis 292. The covering member 224 may include a cover surface 246 that surrounds the thermal terminal surfaces 225a, 225b, 225c such that the cover surface 246 and the thermal terminal surfaces 225a, 225b, 225c cooperatively define the first side 251 of the bus bar member 220. In some embodiments, the cover surface 246 that is adjacent at least one of the thermal terminal surfaces 225a, 225b, 225c may be substantially flush therewith. In some embodiments, a substantial portion of the cover surface 246 and the plurality of thermal terminal surfaces 225a, 225b, 225c may be substantially flush to cooperatively define a flat, planar surface. "Substantially" in this context and throughout this document should be interpreted so as to allow for reasonable manufacturing tolerancing.

Figure 5:
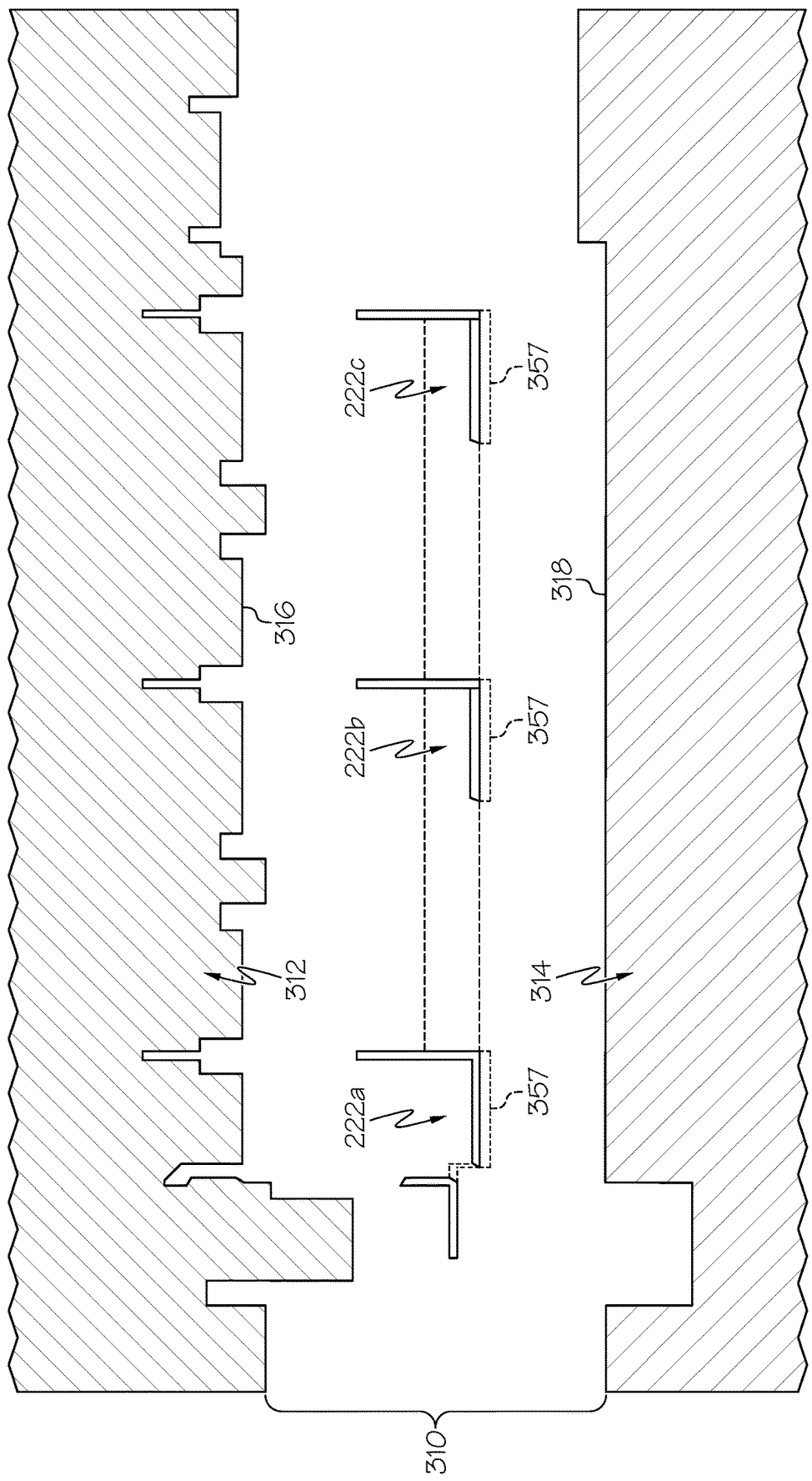
FIG. 5 is a schematic section view representing a method of manufacturing the bus bar member of FIG. 3 according to example embodiments, wherein a molding machine is shown in an open position.
Figure 6:
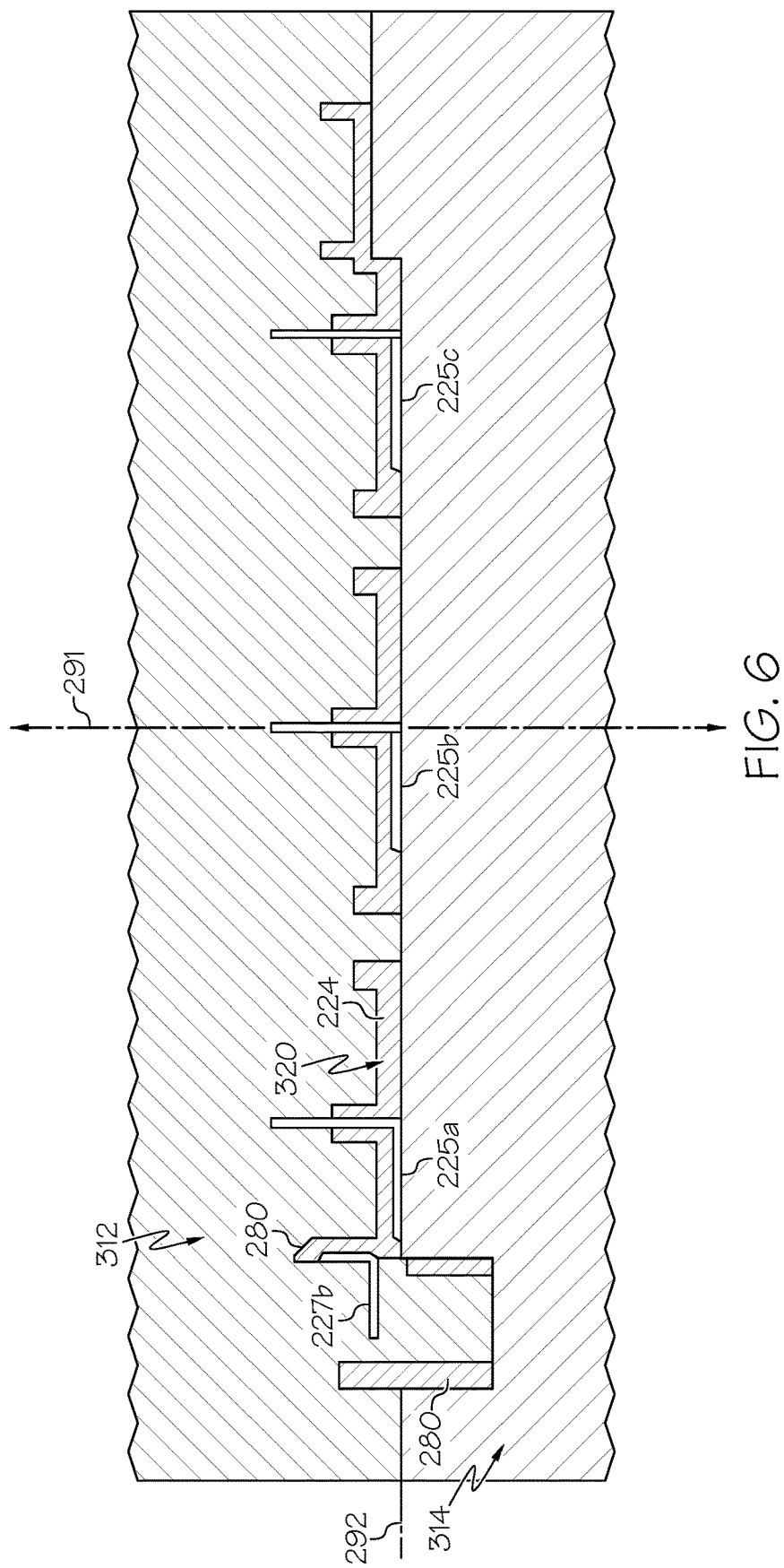
FIG. 6 is a schematic section view of the molding machine of FIG. 5 shown in a closed position.

The covering member 224 may be made of any suitable electrically-insulating material (e.g., a rigid, insulating polymer). The covering member 224 may, in some embodiments, be co-molded with the bus bars 222a, 222b, 222c as represented in FIGS. 5 and 6. In additional embodiments, the covering member 224 may include one or more parts that are press-fit, heat-staked, or otherwise attached to the one or more bus bars 222a, 222b, 222c.

As shown, a molding machine 310 with at least one first die 312 and at least one opposing second die 314 may be supported for movement relative to each other between an open position (FIG. 5) and a closed position (FIG. 6). When in the closed position, a first molding surface 316 of the first die 312 and a second molding surface 318 of the second die 314 may cooperatively define a molding cavity 320.

As shown in FIG. 5, the bus bars 222a, 222b, 222c may be supported between the first molding surface 316 and the second molding surface 318. Then, with the molding machine 310 closed (FIG. 6), material for the covering member 224 may be included in the cavity 320, and the covering member 224 may be molded and formed around the bus bars 222a, 222b, 222c. The material may be cured, solidified, etc. forming the unitary, one-piece bus bar member 220 shown in FIG. 3. In some embodiments, the thermal terminal surfaces 225a, 225b, 225c may be formed (i.e., left exposed) from the covering member 224 via the molding process itself due to the configuration of the second molding surface 318. In other words, the second molding surface 318 may mask at least one of the thermal terminal surfaces 225a, 225b, 225c of the bus bars 222a, 222b, 222c during the overmolding process. In other embodiments, an optional mask 357 (FIG. 5) that is separate from the second molding surface 318 may be applied (i.e., attached, sprayed-on, etc.), and the mask 357 may be used to form the exposed thermal terminal surfaces 225a, 225b, 225c.

Figure 7:
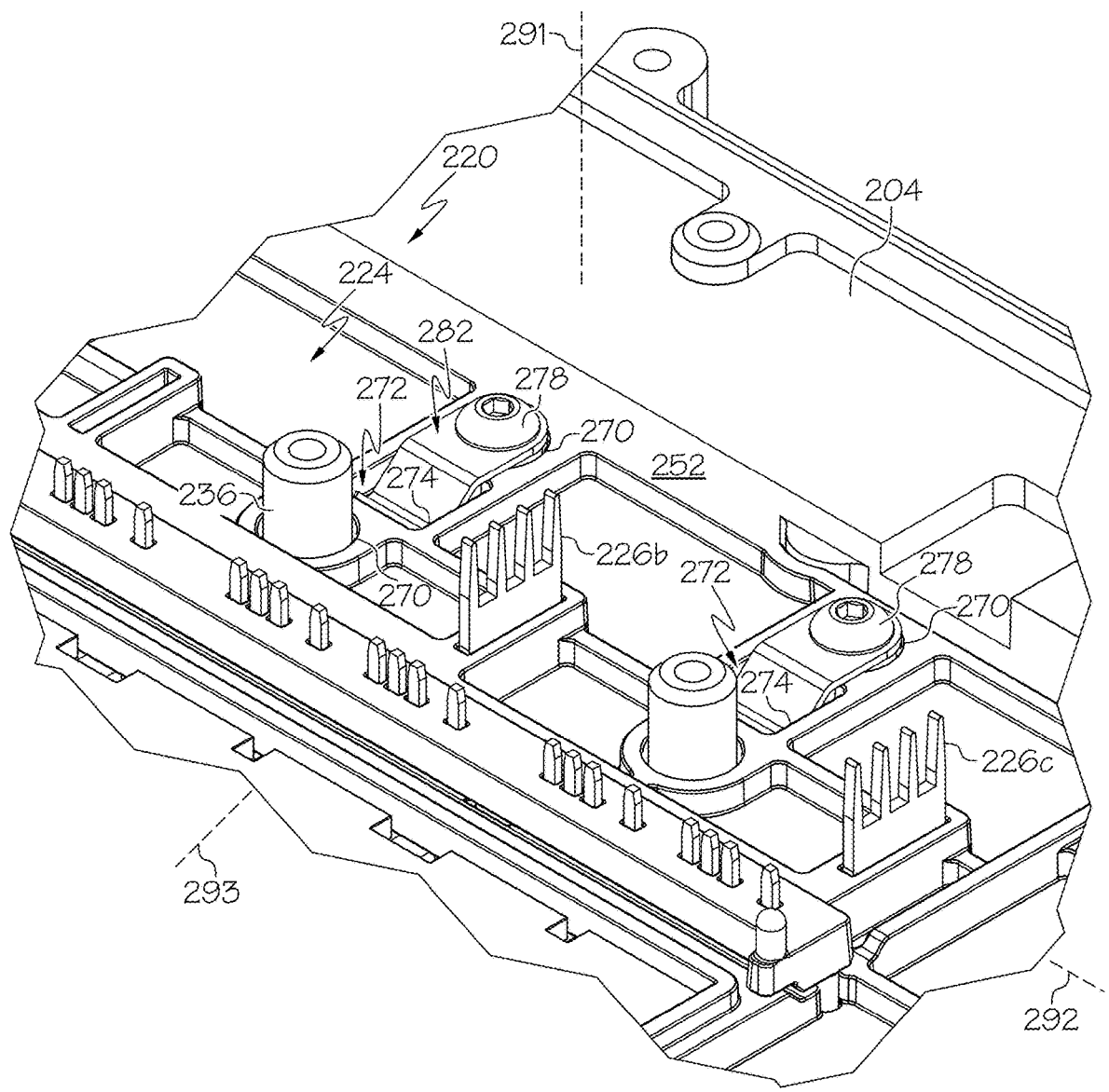
FIG. 7 is a perspective view of a portion of the controller including biasing members that bias the bus bar member of FIG. 3.

The covering member 224 may be formed to include at least one first aperture 270 as shown in FIGS. 3 and 7. For example, the first aperture 270 may be a through-hole that extends through the thickness of the covering member 224 along the first axis 291. There may be a plurality of first apertures 270 (e.g., four) in some embodiments; however, there may be a different number, and they may be configured differently (e.g., recesses, etc.) without departing from the scope of the present disclosure.

As shown in FIG. 7, the covering member 224 may be formed to include at least one second aperture 272. In some embodiments, there may be a plurality of second apertures 272 (e.g., two). In some embodiments, the second apertures 272 may comprise recesses in the second side 252 of the covering member 224. The second apertures 272 may include at least one flat surface 274 that defines the interior of the recess. In some embodiments, the second apertures 272 may be rectangular and recessed into the second side 252 so as to include a plurality of flat surfaces 274. The second apertures 272 may be disposed proximate respective ones of the first apertures 270.

Furthermore, as shown in FIG. 6, the covering member 224 may be formed such that the terminal ends 227a, 227b, 227c are also exposed from the covering member 224. (FIG. 6 shows this exposure of terminal end 227b and it will be appreciated that the other terminal ends 227a, 227c may be similarly exposed from the covering member 224.) Additionally, the covering member 224 may be formed to include a wall 280 that extends about the plurality of terminal ends 227a, 227b, 227c. The wall 280 may be disposed at one end of the covering member 224 and may project along the first axis 291 from the other portions of the cover surface 246. In some embodiments, the wall 280 may define an end aperture 276 (FIGS. 2 and 6). The end aperture 276 may be a cylindrical, tubular, pipe-shaped, or otherwise configured with at least open continuous opening from the first side 251 to the second side 252 of the covering member 224.

Once formed, the bus bar member 220 may be assembled into the controller housing 202 as shown in FIG. 2. As shown, the bus bar member 220 may be stacked, layered, etc. below the PCB assembly 210 and atop the heat sink member 230. The forked PCB connector ends 226a, 226b, 226c may be electrically connected to the PCB assembly 210. One or more first apertures 270 may receive respective ones of the posts 236 as shown in FIG. 7 for retaining the controller 200 together.

Furthermore, other first apertures 270 may receive fasteners 278, such as bolts that fasten at least one biasing member 282 to the controller 200. In some embodiments, there may be a plurality of biasing members 282 (e.g., two). The biasing members 282 may be spring members (spring fasteners, spring clips, resilient strips, etc.) that extend from the fastener 278 to overlap the second side 252 of the bus bar member 220 and retain the bus bar member 220 against the heat sink member 230. In some embodiments, the biasing members 282 may be received in respective ones of the second apertures 272 and may be seated against one or more of the flat surfaces 274. The biasing member 282 may also be resiliently bent with the fastener 278 fixed to support structure (e.g., the heat sink member 230) of the controller 200 such that that the biasing members 282 apply a biasing load (a force that urges the bus bar member 220 (and the exposed thermal terminal surfaces 225a, 225b, 225c) toward the second side 235 of the heat sink member 230. In some embodiments, the bus bar member 220 may be biased into the heat sink member 230 to maintain abutting contact between the thermal terminal surfaces 225a, 225b, 225c and the second side 235 of the heat sink member 230. Areas of the second side 235 that contact the thermal terminal surfaces 225a, 225, 225c may be correspondingly shaped (e.g., flat and planar) for face-to-face surface contact and thermal connection. Accordingly, the bus bars 222a, 222b, 222c may be conductively cooled by the heat sink member 230.

The controller housing 202 may be mounted on the housing 101 of the turbomachine 100. A wire connector 400 (FIG. 2), wiring harness, etc. may be attached to the terminal ends 227a, 227b, 227c and may extend out from the end aperture 276. An electrically insulating plug 402 may be inserted in the opposite end of the aperture 276 as shown in FIG. 2.

Further, as shown in FIG. 2, the controller 200 may include, may be operatively coupled with, and/or may be configured with a fluid cooling system 240. The fluid cooling system 240 may include one or more fluid passages 242 that are defined between an interior surface 244 of the inner housing member 204 and the first side 233 of the heat sink member 230. The fluid passage 242 may have a generally flat, rectangular cross-sectional profile as shown in FIG. 2. The fluid passage 242 may define a flow axis 289, and in some embodiments, the flow axis 289 may be substantially parallel to the third axis 293 to flow across the first side 233 of the heat sink member 230, convectively removing heat from the heat sink member 230 in the process.

Coolant may flow through the fluid passage 242 of the fluid cooling system 240. The coolant may be a gaseous or liquid coolant, which is input from a fluid inlet 284 and which is output from a fluid outlet 286 (FIG. 1). The fluid inlet 284 and the fluid outlet 286 may be include a respective opening or other conduit through the controller housing 202. The coolant may flow across the first side 233 of the heat sink member 230 to remove heat therefrom and cool the controller 200.

It will be appreciated that the thermal terminal surfaces 225a, 225b, 225c are configured for highly effective heat transfer out of the bus bar member 220. The thermal terminal surfaces 225a, 225b, 225c may be located within the bus bar member 220 relative to thermally-sensitive portions of the controller 200. For example, the thermal terminal surfaces 225a, 225b, 225c may be located in close proximity to MOSFETs that are included in the controller 200 to provide effective cooling. The thermal terminal surfaces 225a, 225b, 225c themselves may have relatively large surface area of contact and exposure to the heat sink member 230. The mating, thermally-connected faces may be flat, planar and face-to-face to maintain high thermal conductivity. The biasing members 282 also ensure contact with the heat sink member 230. The fluid cooling system 240 is thermally connected to the heat sink member 230 to receive heat therefrom and further increase the cooling effect for the controller 200. Accordingly, the controller 200 may operate within preferred thermal conditions. These features are provided in a compact and light-weight package. Additionally, the bus bar member 220 and the controller 200 provides a number of manufacturing efficiencies.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the present disclosure in any way. Rather, the foregoing detailed description will provide those skilled in the art with a convenient road map for implementing an exemplary embodiment of the present disclosure. It is understood that various changes may be made in the function and arrangement of elements described in an exemplary embodiment without departing from the scope of the present disclosure as set forth in the appended claims.

What is claimed is:

1. A turbomachine comprising:
   a rotating group with a wheel supported on a shaft;
   a housing that houses the wheel for rotation therein about an axis of rotation;
   an e-machine section with an e-machine operatively connected to the shaft and configured to convert energy between the e-machine and the shaft as the shaft rotates; and
   a controller configured for control of the e-machine, the controller including a bus bar member that includes a bus bar that is partly covered over by an electrically-insulative covering member, the covering member having a first side and a second side that faces opposite the first side, the bus bar including a thermal pad and an electrical connector that extends from the thermal pad and that projects from the first side, the thermal pad having a thermal terminal surface that is exposed from the second side of the covering member, the controller including a heat sink member facing the second side, the thermal terminal surface being thermally connected to the heat sink member with the heat sink member configured to receive heat from the bus bar member.

2. The turbomachine of claim 1, wherein the thermal terminal surface includes a flat surface that overlies the heat sink member.

3. The turbomachine of claim 2, wherein the electrically-insulative covering member includes a cover surface that is adjacent the flat surface and that is substantially flush therewith.

4. The turbomachine of claim 1, further comprising a fluid cooling system for a flow of a fluid coolant proximate the heat sink member to remove heat from the heat sink member.

5. The turbomachine of claim 4, wherein the heat sink member includes a heat sink first side that faces away from the thermal terminal surface and a heat sink second side that faces the thermal terminal surface; and
   wherein the fluid cooling system includes a passage that defines a flow axis for a coolant, the flow axis directed across the heat sink first side.

6. The turbomachine of claim 1, further comprising a biasing member configured to bias the bus bar member toward the heat sink member.

7. The turbomachine of claim 6, wherein the biasing member is a spring fastener that abuts the covering member to bias the thermal terminal surface toward the heat sink member.

8. The turbomachine of claim 7, wherein the covering member includes a recess that receives the spring fastener.

9. The turbomachine of claim 8, wherein the recess includes a flat surface that defines the recess.

10. The turbomachine of claim 1, wherein the bus bar includes a terminal end; and
    wherein the terminal end is also exposed from the covering member.

11. The turbomachine of claim 10, wherein the thermal terminal surface is substantially planar; and
    wherein the terminal end is disposed in a plane that is substantially parallel to the thermal terminal surface.

12. The turbomachine of claim 1, wherein the bus bar is a first bus bar of the bus bar member, the first bus bar including the thermal terminal surface that is a first thermal terminal surface of the bus bar member; and
    wherein the bus bar member includes a second bus bar that is partly covered over by the covering member, the second bus bar including a second thermal terminal surface that is exposed from the covering member, the thermal terminal surface being thermally connected to the heat sink member with the heat sink member configured to receive heat from the bus bar member.

13. A method of manufacturing a turbomachine comprising:
    supporting a wheel of a rotating group on a shaft;
    housing the wheel in a housing for rotation therein about an axis of rotation;
    providing an e-machine section with an e-machine operatively connected to the shaft and configured to convert energy between the e-machine and the shaft as the shaft rotates; and
    supporting a controller on the turbomachine, the controller configured for control of the e-machine, the controller including a bus bar member that includes a bus bar that is partly covered over by an electrically-insulative covering member, the covering member having a first side and a second side that faces opposite the first side, the bus bar including a thermal pad and an electrical connector that extends from the thermal pad and that projects from the first side, the thermal pad having a thermal terminal surface that is exposed from the second side of the covering member, the controller including a heat sink member facing the second side, the thermal terminal surface being thermally connected to the heat sink member with the heat sink member configured to receive heat from the bus bar member.

14. The method of manufacturing the turbomachine of claim 13, further comprising forming the bus bar member by overmolding the covering member on the bus bar.

15. The method of manufacturing of claim 13, wherein the thermal terminal surface includes a flat surface that overlies the heat sink member.

16. The method of manufacturing of claim 15, wherein the electrically-insulative covering member includes a cover surface that is adjacent the flat surface and that is substantially flush therewith.

17. The method of manufacturing of claim 13, further comprising attaching a fluid cooling system for a flow of a fluid coolant proximate the heat sink member to remove heat from the heat sink member.

18. The method of manufacturing of claim 17, wherein the heat sink member includes a heat sink first side that faces away from the thermal terminal surface and a heat sink second side that faces the thermal terminal surface and; and
    wherein the fluid cooling system includes a passage that defines a flow axis for a coolant, the flow axis directed across the heat sink first side.

19. The method of manufacturing of claim 13, further comprising attaching a biasing member to bias the bus bar member toward the heat sink member.

20. A turbomachine comprising:
a rotating group with a wheel supported on a shaft;
a housing that houses the wheel for rotation therein about an axis of rotation;
an e-machine section with an electric motor operatively connected to the shaft and configured to drive the shaft in rotation;
a controller configured for control of the electric motor, the controller including a printed circuit board (PCB) with a circuit element and a bus bar member that includes a plurality of bus bars that are partly covered over by an electrically-insulative covering member, the covering member having a first side and a second side that faces opposite the first side, the first side facing the PCB, the bus bars respectively including a thermal pad and a PCB connector that extends from the thermal pad and that projects from the first side to electrically connect to the circuit element, the thermal pad having a thermal terminal surface that is exposed from the second side of the covering member, the controller including a heat sink member, the second side facing the heat sink member, the thermal terminal surface being thermally connected to the heat sink member with the heat sink member configured to receive heat from the bus bar member; and
a fluid cooling system for a flow of a fluid coolant proximate the heat sink member to remove heat from the heat sink member.

* * * * *